United States Patent [19]

Woodman, Jr.

[11] Patent Number: 4,633,997
[45] Date of Patent: Jan. 6, 1987

[54] REDESIGNED BODY CENTERING MECHANISM

[75] Inventor: Daniel W. Woodman, Jr., Beverly, Mass.

[73] Assignee: USM Corporation, Farmington, Conn.

[21] Appl. No.: 738,250

[22] Filed: May 28, 1985

[51] Int. Cl.$^4$ ............................................. B65G 47/26
[52] U.S. Cl. ................................. 198/456; 198/599; 198/636
[58] Field of Search ............... 198/456, 836, 499, 599, 198/636, 534; 271/220, 273, 274, 275; 221/311, 312 R

[56] References Cited

U.S. PATENT DOCUMENTS

| 3,648,823 | 3/1972 | Neer | 198/836 X |
| 3,952,863 | 4/1976 | Schattauer | 198/499 |
| 3,994,388 | 11/1976 | Reiter | 198/499 |
| 4,034,893 | 7/1977 | Tardiff et al. | 221/225 X |

FOREIGN PATENT DOCUMENTS 509696  3/1956  Fed. Rep. of Germany ...... 271/275

Primary Examiner—Joseph E. Valenza
Assistant Examiner—Jonathan D. Holmes
Attorney, Agent, or Firm—Alan N. McCartney

[57] ABSTRACT

A mechanism for centering the body of an electrical component in a carrier during a phase of processing the component. A pair of centering fingers are pivotally supported for movement toward and away from the carrier and adjustably downwardly biased toward the carrier to accurately position the centering fingers at the juncture of the component body and leads during centering.

4 Claims, 5 Drawing Figures

REDESIGNED BODY CENTERING MECHANISM

BACKGROUND OF THE INVENTION

1. Field of the Invention

A mechanism for centering the body of an electrical component during a phase of processing the component.

2. Summary of the Prior Art

In the processing of electrical components having a body portion with extending leads, it is necessary to center the body during different phases of handling the component. For example, U.S. Pat. No. 4,034,893 illustrates a machine for sequencing components. Individual components of diverse size and shape may be selected in a predetermined sequence from a plurality of different sources and placed on a coveyor. The sequenced components are transferred to a retaping mechanism which has a pair of tapes to which the opposed leads of the components are secured. In this fashion, the components are taped together in the desired sequence for ultimate insertion into a printed circuit board.

In the phase of the process of transferring the components from the conveyor to the retaping mechanism, it is desirable to pass the components through a body centering mechanism which centers the body of the component between the tapes for the component leads so that the components are uniformly aligned between the tapes. Other patents disclosing such a sequencing machine are U.S. Pat. Nos. 3,669,309 and 4,119,206.

The body centering mechanism must be adjustable to accommodate the various component sizes and shapes and delicate light weight nature of the components. Further, the adjustment means for the centering mechanism must be easily accessible during machine set up.

SUMMARY OF THE INVENTION

It is an object of this invention to provide an electrical component body centering mechanism that can position the bodies of components having diverse sizes and shapes centerally of a portion of the component handling apparatus of a machine.

It is another object of this invention to provide a pair of pivotally supported leaf spring type centering fingers in a channel between one processing station and another of an electrical component handling apparatus; the centering fingers being downwardly biased into the channel so that the bodies of components passing through the channel will be contacted by the centering fingers and centered in the channel. The centering fingers are adjustably downwardly biased to assure contact with the body - lead junctions by means of a counter weight or a spring to assure the centering fingers contact each of the body portions of all the components of diverse size and shape that are being processed without bending, deforming or otherwise damaging the component leads.

BRIEF DESCRIPTION OF THE PREFERRED EMBODIMENT

The body centering mechanism 10 of this invention is illustrated in the environment of an electrical component sequencing machine, however, it will be appreciated that the mechanism 10 can be used in any electrical component processing apparatus wherein it is necessary to center components of the same or diverse size and shape between one processing station and another of the apparatus without damage to the component.

The sequencing machine disclosed herein is similar to that illustrated in commonly owned U.S. Pat. No. 4,034,893 and for the purpose of disclosing an operative environment for the body centering mechanism of this invention, the disclosure of that patent is incorporated herein by reference.

Figure 1:
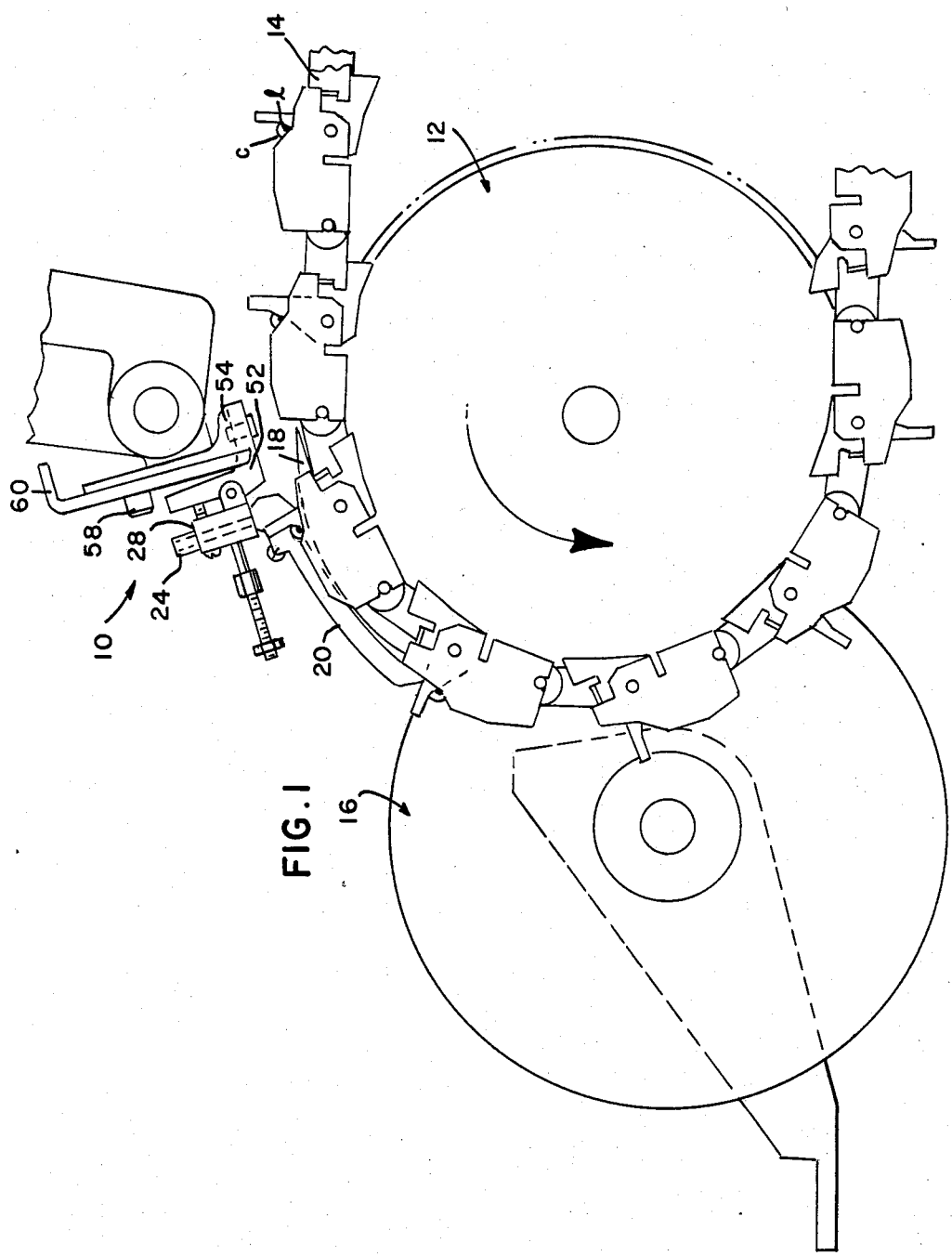
FIG. 1 illustrates the body centering mechanism between two processing stations of a machine.

Attention is directed to FIG. 1 which illustrates a portion of a sequencing machine 12 which has a pair of spaced articulated carriers 14 (one of which is shown) that transport components (c) by their leads (l) through the body centering mechanism 10 and deposit the components (c) on the retaping station 16.

The body centering mechanism 10 is located in the path of the carriers 14 and between the carriers 14 and the retaping station. As the components are positioned on the carriers from their source and are transported by the carrier, vibrations occurring during handling of the component will misalign the component body on the carrier. Thus, it is necessary to pass the components through the centering mechanism 10 to align the components and place the component body in the center between the opposed tapes during retaping. Further, since the component leads are easily bent or misformed and various sizes and shapes of components must be accommodated, it is necessary that the centering mechanism delicately contact the component body and leads. Thus, provisions must be made for accurately and precisely adjusting the downward force exerted by the centering mechanism that is required to contact and align the component body during centering.

The components (c) are passed through the chute 18 in which a pair of pivotally mounted leaf spring type centering fingers 20, 22 are positioned. The centering fingers 20, 22 are supported by pins 24, 26 pivotally mounted in openings 31 in block 28. The upper ends 30 of pins 24, 26 are mounted in adjusting clamps 32, 34. The clamps 32, 34 have spaced slots 36 and lock screws 38 to secure the clamps 32, 34 to the pin ends 30. An opening 40 in end 41 in clamp 32 receives a pin 42 which passes down through slot 44 in end 45 of clamp 34. By loosening the lock screws 38 and moving the ends 41 and 45 of clamps 32, 34 forward or rearward and resecuring the clamps 32, 34 the spacing between the centering fingers can be adjusted. The clamps 32, 34 also cause the leaf springs to act in unison and maintain the leaf springs equal distant from the center line of the component. Also positioned between the centering fingers 20, 22 is a return spring 46.

The block 28 has tabs 48 pivotally attached by pin 50 to the lower portion of the L-shaped support 52. The lower leg 54' of support 52 is attached to bracket 54 by a bolt 53 passing through slotted opening 56. The bracket 54 is vertically adjustably attached by bolt 58 to the support 60. Thus, the block and centering fingers 20, 22 are longitudinally adjustable by the attachment of L-shaped support 52 to the bracket 54 by the slotted connection of bolt 53 and vertically adjustable by the connection of bracket 54 to support 60.

The downward pivotal movement of block 28 on support 52 is limited by the adjusting screw 62 passing through opening 64 in block 28 and threaded into support 52. This permits finite adjustment of the lower most position of centering fingers 20, 22 in chute 18. The screw 62 is locked into support 52 by set screw 57.

Since a variety of different sizes and shapes of components are positioned by the centering mechanism, provision is made to slightly downwardly bias the centering fingers to assure their contact with the component body-lead juncture. Further, because of the delicate nature of the components, this downward bias must be ajustable during machine set-up to obtain the optimum positioning of the component in the chute.

Figure 2:
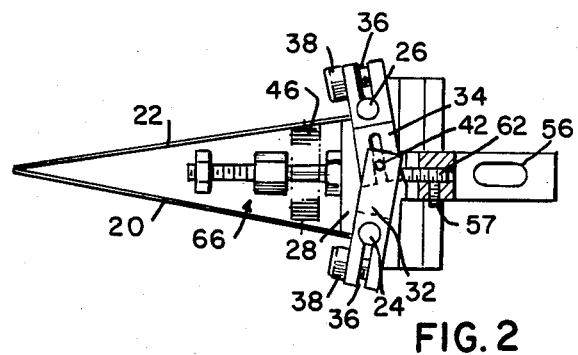
FIG. 2 is a top plan view of the mechanism.
Figure 3:
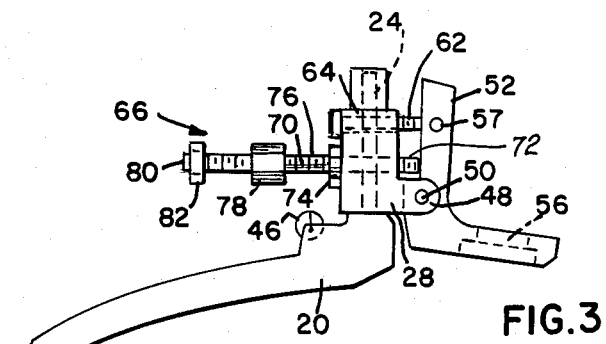
FIG. 3 is a side view of the mechanism.

In the preferred embodiment, there are two different modes of downwardly biasing the centering fingers 20, 22. FIGS. 2 and 3 illustrate using an adjustable counterweight 66 and FIG. 4 illustrates an adjustable spring mechanism 68.

The counterweight 66 comprises a stud 70 threaded through the block 28 and has an end 72 abutting the support 52 to adjustably limit the upward pivotal movement of the centering fingers 20, 22. A lock nut 74 secures the adjusted position of the stud 70 in block 28. The central portion 76 of stud 70 has a hex head 78 for turning the stud 70 into block 28. The threaded end 80 of stud 70 carries a nut 82 the weight of which acts about pivot pin 50 to downwardly bias the centering fingers 20, 22 into the channel 18. The nut 82 can be threaded onto the stud 50 to finitely adjust the downward bias of the centering fingers 20, 22.

Figure 4:
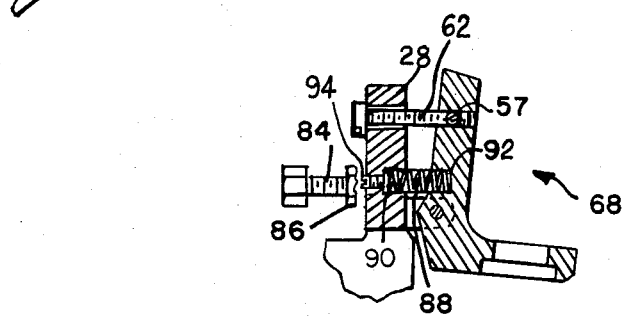
FIG. 4 is a sectional view showing the spring biasing feature of the mechanism.
Figure 5:
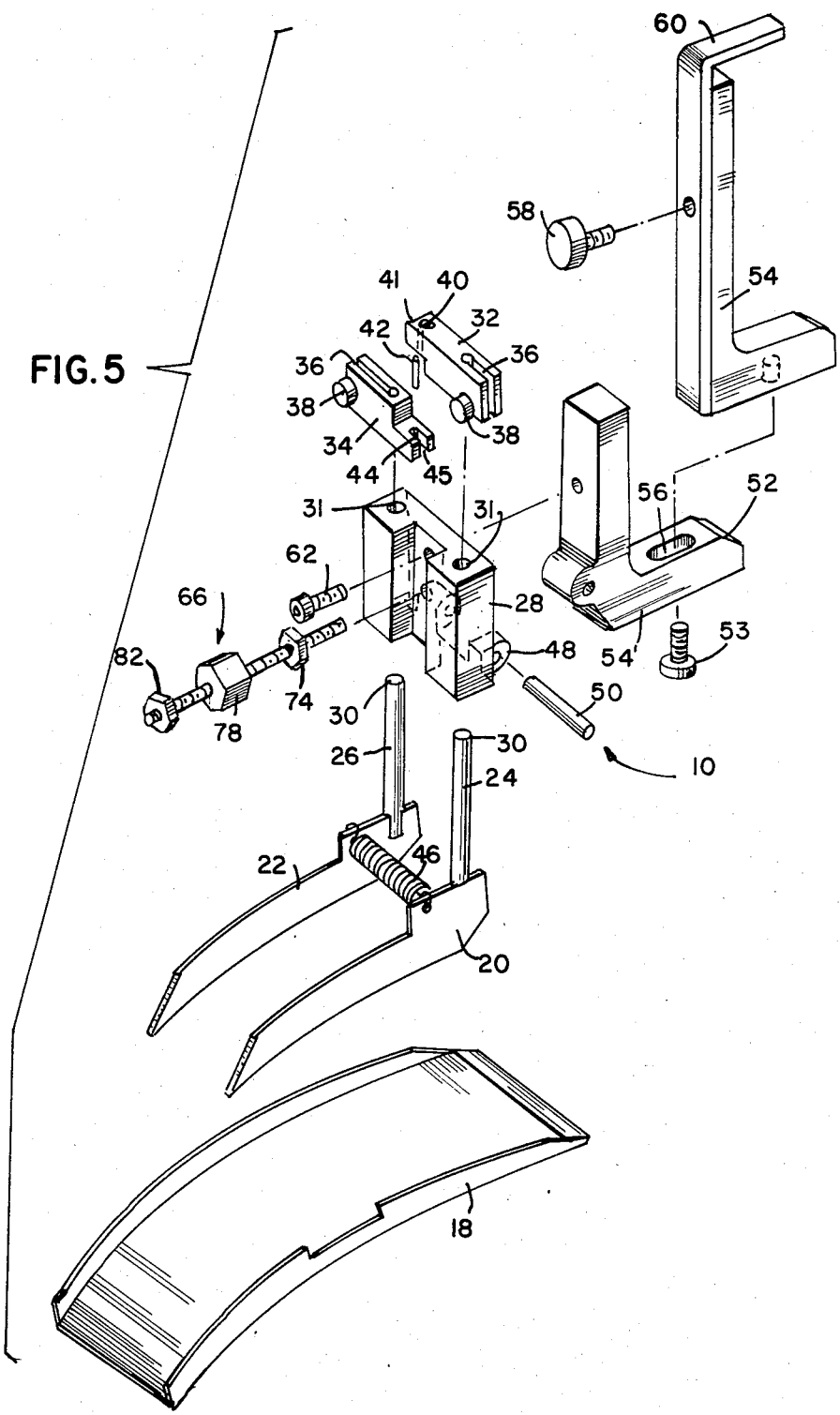
FIG. 5 is an exploded view of the mechanism.

Attention is now directed to FIG. 4 which illustrates the adjustable spring mechanism 68. A stud 84 is threaded into block 28 and abuts support 52 to limit the upper pivotal movement of the centering fingers 20, 22. A lock nut 86 secures stud 84 in its adjusted position. Offset from stud 84 is a spring 88 positioned in opening 90 of block 28 and opening 92 of support 52. A set screw 94 in block 28 will adjust the load of spring 88 to adjust the downward bias of the centering fingers 20, 22.

In operation, as the components are passed through the chute 18 by the carriers 14, the centering fingers 20, 22 will contact the juncture of the component body and leads and pivot in block 28 to center the component. Because the centering fingers 20, 22 are connected through clamps 30, 32, they will separate equally from the center line and center the component body in the chute 18 for further downstream processing.

It can thus be seen that with either the counterweight 66 or spring mechanism 68, the downward bias of centering fingers 20, 22 can be easily adjusted during the set up of the machine. The counterweight nut 82 is easily accessible as is the set screw 94 to the operator during machine set up. It has been determined this is a more reliable and accurate adjustment for positioning the centering fingers than the use of leaf springs to load the components against the centering fingers that are fixed vertically, as illustrated in commonly owned U.S. Pat. No. 4,034,893. In this latter patented device a time consuming process was necessary to set up the correct pressure between the leaf springs and the centering fingers as the leaf springs would vary in both temper and dimension. Thus, in this invention a more accurate and easily adjustable control for the bias of the centering fingers against the component has been accomplished.

I claim:

1. A mechanism for centering the body of an electrical component having leads in a carrier during a phase of processing the component, comprising:
   a. a chute positioned adjacent the carrier and adapted to guidingly support the component by its leads only free from contact with its body portion;
   b. a pair of centering fingers pivotally mounted in a block for movement toward and away from one another equal distant from a center line;
   c. a support pivotally carrying said block above said chute for movement of said centering fingers toward and away from said chute;
   d. means positioned between said block and said support for adjustably limiting the downward pivotal movement of said centering fingers toward said chute;
   e. a stud threaded through said block and abutting said support to limit the upward pivotal movement of said centering fingers from said chute;
   f. adjustable means associated with said block for downwardly biasing said centering fingers toward said chute to assure contact of said centering fingers with the juncture of the component body and leads;
   g. said adjustable means being spaced from said chute and exposed from the surface of said block to be easily accessible for adjustment to vary the downward bias of said centering fingers; and
   h. said adjustable means is a counterweight threaded on said stud to bias said centering fingers toward said chute 2. A mechanism for centering the body of an electrical component having leads in a carrier during a phase of processing the component, comprising:
   a. a chute positioned adjacent the carrier and adapted to guidingly support the component by its leads only free from contact with its body portion;
   b. a pair of centering fingers pivotally mounted in a block for movement toward and away from one another equal distant from a center line;
   c. a support pivotally carrying said block above said chute for movement of said centering fingers toward and away from said chute;
   d. means positioned between said block and said support for adjustably limiting the downward pivotal movement of said centering fingers toward said chute;
   e. a stud threaded through said block and abutting said support to limit the upward pivotal movement of said centering fingers from said chute;
   f. adjustable means associated with said block for downwardly biasing said centering fingers toward said chute to assure contact of said centering fingers with the juncture of the component body and leads;
   g. said adjustable means being spaced from said chute and exposed from the surface of said block to be easily accessible for adjustment to vary the downward bias of said centering fingers; and
   h. said adjustable means is a spring positioned between said block and said support and a set screw to adjust the spring load to vary the downward bias of said centering fingers.

3. The mechanism of claim 2 wherein said spring is mounted in an opening in said block and an opening in said support, with said set screw being threaded into the opening in said support to adjust the spring load.

4. The mechanism of claim 3 wherein said spring is offset from said stud.

* * * * *